(12) United States Patent
Lee et al.

(10) Patent No.: US 12,183,419 B2
(45) Date of Patent: Dec. 31, 2024

(54) PROGRAMMABLE COLUMN ACCESS

(71) Applicant: Micron Technology, Inc., Boise, ID (US)

(72) Inventors: Hyunyoo Lee, Boise, ID (US); Kang-Yong Kim, Boise, ID (US); Taeksang Song, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/648,403

(22) Filed: Jan. 19, 2022

(65) Prior Publication Data

US 2022/0406344 A1    Dec. 22, 2022

Related U.S. Application Data

(60) Provisional application No. 63/211,912, filed on Jun. 17, 2021.

(51) Int. Cl.
*G11C 7/10*      (2006.01)
*G11C 8/06*      (2006.01)
*G11C 11/4074*   (2006.01)

(52) U.S. Cl.
CPC ......... *G11C 7/1039* (2013.01); *G11C 7/1012* (2013.01); *G11C 7/1063* (2013.01); *G11C 7/109* (2013.01); *G11C 8/06* (2013.01); *G11C 11/4074* (2013.01)

(58) Field of Classification Search
CPC ... G11C 7/1039; G11C 7/1012; G11C 7/1063; G11C 7/109; G11C 8/06; G11C 11/4074
See application file for complete search history.

(56) References Cited

U.S. PATENT DOCUMENTS

| 8,675,421 B2 * | 3/2014 | Cho ....................... G11C 16/26 365/206 |
| 9,368,191 B2 * | 6/2016 | O'Connell .......... G11C 11/4091 |
| 10,269,411 B2 * | 4/2019 | Vogelsang .......... G06F 13/1694 |

* cited by examiner

*Primary Examiner* — Vanthu T Nguyen
(74) *Attorney, Agent, or Firm* — Holland & Hart LLP

(57) ABSTRACT

Methods, systems, and devices for programmable column access are described. A device may transfer voltages from memory cells of a row in a memory array to respective digit lines for the memory cells. The voltages may be indicative of logic values stored at the memory cells. The device may communicate respective control signals to a set of multiplexers coupled with the digit lines, where each multiplexer is coupled with a respective subset of the digit lines. Each multiplexer may couple a digit line of the respective subset of digit lines with a respective sense component for that multiplexer based on the respective control signal for that multiplexer.

24 Claims, 8 Drawing Sheets

PROGRAMMABLE COLUMN ACCESS

CROSS REFERENCE

The present Application for Patent claims the benefit of U.S. Provisional Patent Application No. 63/211,912 by LEE et al., entitled "PROGRAMMABLE COLUMN ACCESS," filed Jun. 17, 2021, assigned to the assignee hereof, and expressly incorporated by reference in its entirety herein.

FIELD OF TECHNOLOGY

The following relates generally to one or more systems for memory and more specifically to programmable column access.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state if disconnected from an external power source.

DETAILED DESCRIPTION

In some memory devices, the memory cells in an array may be arranged in rows of word lines and columns of digit lines. To access data stored in such a memory array, a memory device may activate the word line for a row of memory cells so that the memory cells transfer voltages indicative of stored logic states to the digit lines of the memory cells. The memory device may then select a subset of the digit lines to sense (e.g., multiple digit lines to sense in parallel) by using multiplexers to couple the subset of digit lines with respective sense components. The multiplexers may be controlled using a common (e.g., shared) control signal. But using a common control signal to control the multiplexers may limit the combinations of digit lines that can be sensed in parallel, among other disadvantages, which may increase latency and decrease efficiency.

According to the techniques described herein, a memory device may improve sensing efficiency and latency by using unique and targeted (e.g., respective) control signals to control the multiplexers. For example, a memory device that has n multiplexers for an array may use multiple control signals, such as n control signals (e.g., one per multiplexer), which may have the same or different values. The memory device may determine the values for the n control signals based on (e.g., in response to) activate commands from a host device. To decrease latency relative to other techniques, the host device may issue the activate commands consecutively (e.g., back-to-back, unseparated by other commands such as pre-charge commands or read commands).

Although described with reference to sensing operations, the techniques described herein may be implemented for many other types of operations, such as storage operations.

Features of the disclosure are initially described in the context of systems as described with reference to FIGS. 1 and 2. Features of the disclosure are described in the context of a device, a process flow, and timing diagrams as described with reference to FIGS. 3-6. These and other features of the disclosure are further illustrated by and described with reference to an apparatus diagram and flowcharts that relate to programmable column access as described with reference to FIGS. 7 and 8.

Figure 1:
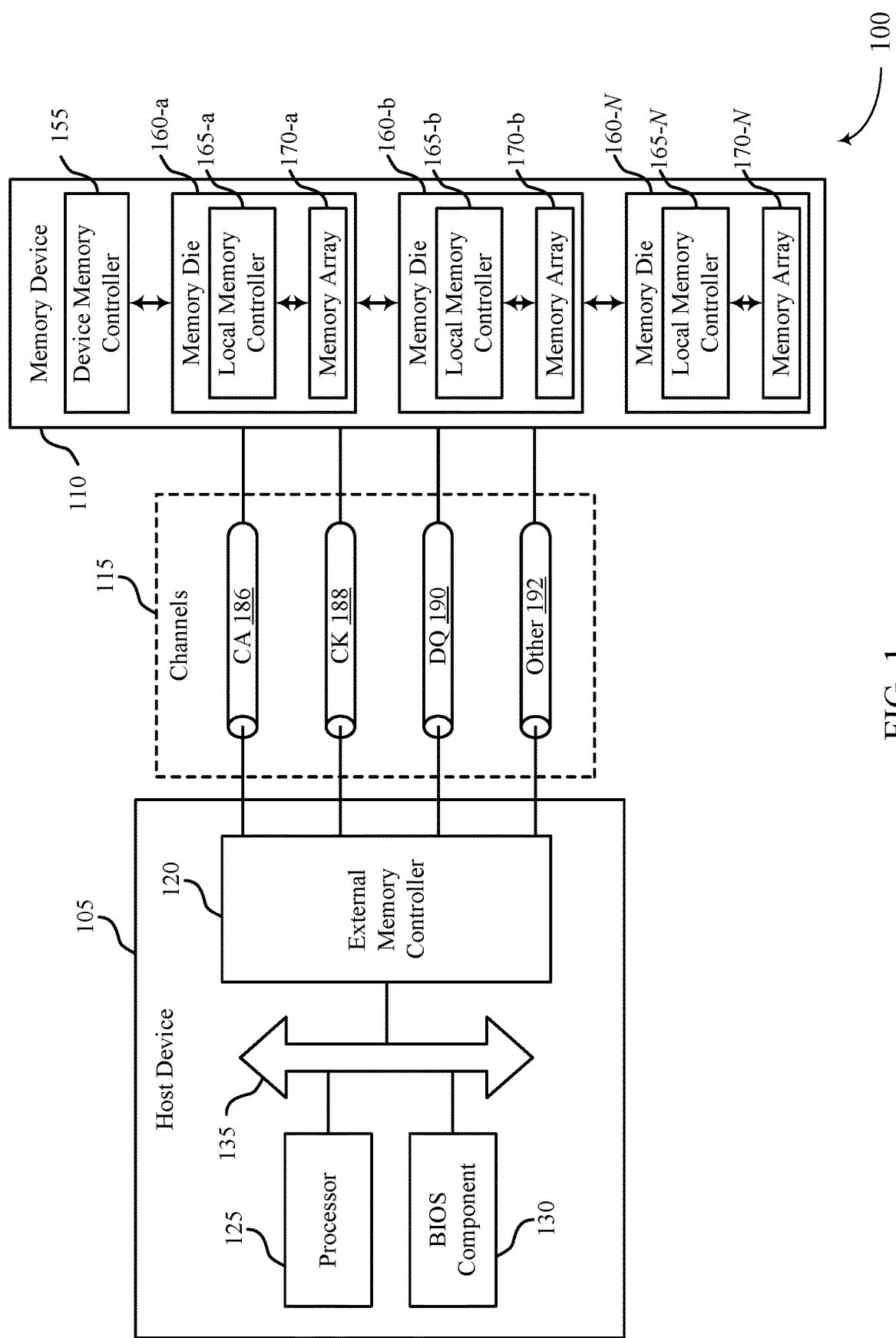
FIG. 1 illustrates an example of a system that supports programmable column access in accordance with examples as disclosed herein.

FIG. 1 illustrates an example of a system 100 that supports programmable column access in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths). In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

A memory die 160 may include one or more memory arrays that include memory cells arranges in rows and columns. For example, the memory cells in a row may share a common word line and the memory cells in a column may share a common digit line. Thus, the memory cells in a row may have different (e.g., respective) digit lines. Due to space limitations or for other reasons, there may be fewer sense components for sensing the memory cells than digit lines. To ensure that each memory cell is accessible, each sense component may be coupled with multiple digit lines via a respective multiplexer. The multiplexer for a sense component may be configurable to couple one of the multiple digit lines with the sense component for sensing while the other digit lines remain isolated from the sense component. The multiplexers for an array may be controlled using a single control signal. But using a single control signal to control the multiplexers may limit the combinations of memory cells that can be sensed at a given time (e.g., in parallel, concurrently, at partially or wholly overlapping times).

According to the techniques described herein, a device may improve sensing by using separate control signals for the multiplexers. For example, if the device includes two multiplexers, the device may control the first multiplexer using a first control signal and may control the second multiplexer using a second control signal. Thus, the first multiplexer may be controlled independently of the second multiplexer, and vice versa, which may improve the granularity and diversity of the sensing operation. The separate control signals for the multiplexers may be communicated to the multiplexers at different times (e.g., serially) or at partially or wholly overlapping times (e.g., in parallel).

The system 100 may include any quantity of non-transitory computer readable media that support programmable column access. For example, the host device 105, the external memory controller 120, the memory device 110, or the device memory controller 155 may include or otherwise may access one or more non-transitory computer readable media storing instructions (e.g., firmware) for performing the functions ascribed herein to the host device 105, the external memory controller 120, the memory device 110, or the device memory controller 155. For example, such instructions, if executed by the host device 105 (e.g., by the processor 125), by the external memory controller 120, by the memory device 110 (e.g., by the device memory controller 155 or a local memory controller 165), may cause the host device 105, the external memory controller 120, the memory device 110, or the device memory controller 155 to perform associated functions as described herein.

Figure 2:
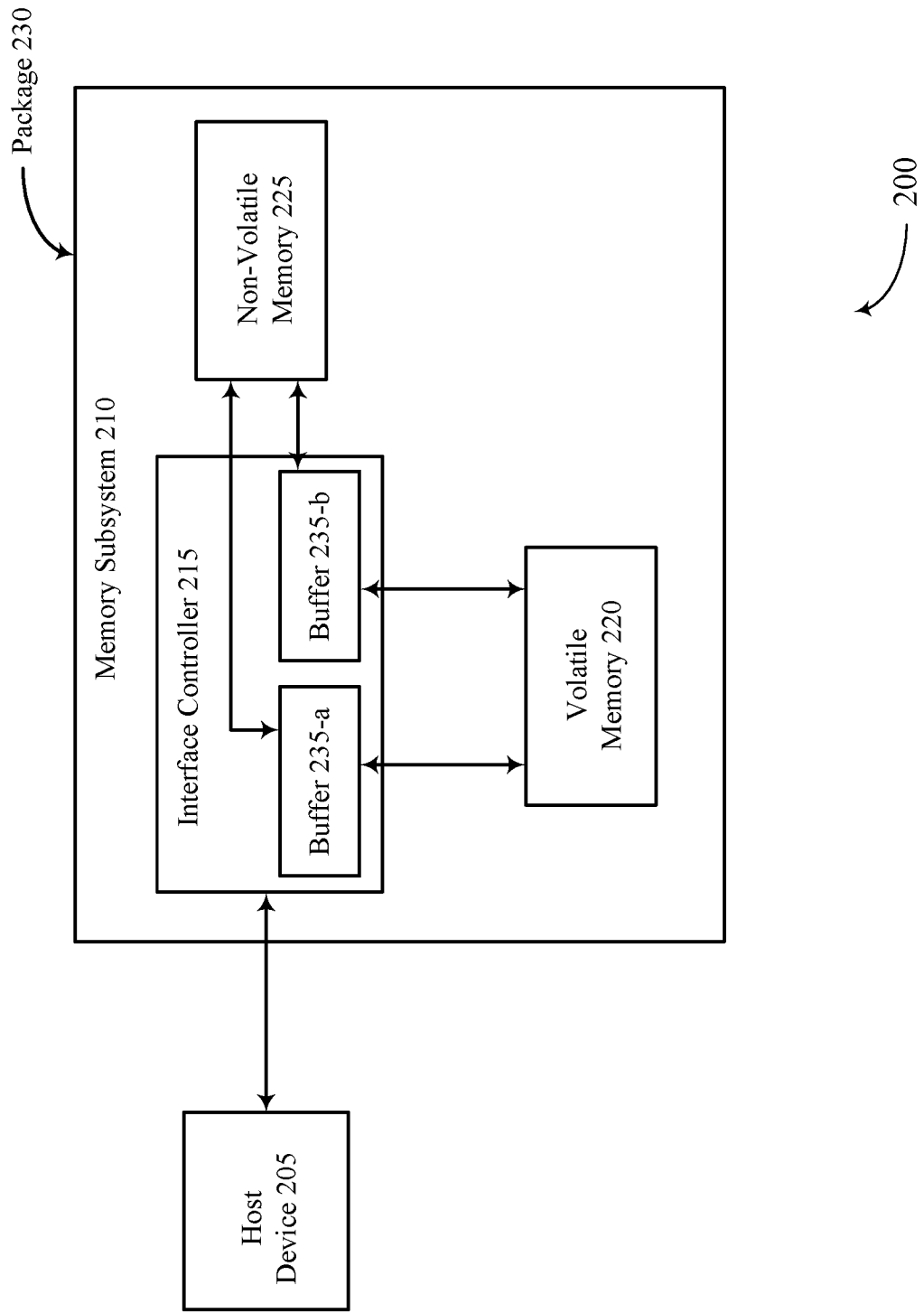
FIG. 2 illustrates an example of a system that supports programmable column access in accordance with examples as disclosed herein.

FIG. 2 illustrates an example of a system 200 that supports programmable column access in accordance with examples as disclosed herein. The system 200 may include a host device 205 and a memory subsystem 210. The host device 205 may be a processor or system-on-a-chip (SoC) that interfaces with the interface controller 215 as well as other components of the electronic device that includes the system 200. The memory subsystem 210 may store and provide access to electronic information (e.g., digital information, data) for the host device 205. The memory subsystem 210 may include an interface controller 215, a volatile memory 220, and a non-volatile memory 225. In some examples, the interface controller 215, the volatile memory 220, and the non-volatile memory 225 may be included in a same physical package such as a package 230. However, the interface controller 215, the volatile memory 220, and the non-volatile memory 225 may be disposed on different, respective dies (e.g., silicon dies).

The memory subsystem 210 may be configured to provide the benefits of the non-volatile memory 225 while maintaining compatibility with a host device 205 that supports protocols for a different type of memory, such as the volatile memory 220, among other examples. For example, the non-volatile memory 225 may provide benefits (e.g., relative to the volatile memory 220) such as non-volatility, higher capacity, or lower power consumption. But the host device 205 may be incompatible or inefficiently configured with various aspects of the non-volatile memory 225. For instance, the host device 205 may support voltages, access latencies, protocols, page sizes, etc. that are incompatible with the non-volatile memory 225. To compensate for the incompatibility between the host device 205 and the non-volatile memory 225, the memory subsystem 210 may be configured with the volatile memory 220, which may be compatible with the host device 205 and serve as a cache for the non-volatile memory 225. Thus, the host device 205 may use protocols supported by the volatile memory 220 while benefitting from the advantages of the non-volatile memory 225.

The host device 205 may be configured to interface with the memory subsystem 210 using a first protocol (e.g., low-power double data rate (LPDDR)) supported by the interface controller 215. Thus, the host device 205 may, in some examples, interface with the interface controller 215 directly and the non-volatile memory 225 and the volatile memory 220 indirectly. In alternative examples, the host device 205 may interface directly with the non-volatile memory 225 and the volatile memory 220. The host device 205 may also interface with other components of the electronic device that includes the system 200. The host device 205 may be or include an SoC, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

The interface controller 215 may be configured to interface with the volatile memory 220 and the non-volatile memory 225 on behalf of the host device 205 (e.g., based on or in response to one or more commands or requests issued by the host device 205). For instance, the interface controller 215 may facilitate the retrieval and storage of data in the volatile memory 220 and the non-volatile memory 225 on behalf of the host device 205. Thus, the interface controller 215 may facilitate data transfer between various subcomponents, such as between at least some of the host device 205, the volatile memory 220, or the non-volatile memory 225. The interface controller 215 may interface with the host device 205 and the volatile memory 220 using the first protocol and may interface with the non-volatile memory 225 using a second protocol supported by the non-volatile memory 225.

The non-volatile memory 225 may be configured to store digital information (e.g., data) for the electronic device that includes the system 200. Accordingly, the non-volatile memory 225 may include an array or arrays of memory cells and a local memory controller configured to operate the array(s) of memory cells. In some examples, the memory cells may be or include FeRAM cells (e.g., the non-volatile memory 225 may be FeRAM). The non-volatile memory 225 may be configured to interface with the interface controller 215 using the second protocol that is different than the first protocol used between the interface controller 215 and the host device 205. In some examples, the non-volatile memory 225 may have a longer latency for access operations than the volatile memory 220. For example, retrieving data from the non-volatile memory 225 may take longer than retrieving data from the volatile memory 220. Similarly, writing data to the non-volatile memory 225 may take longer than writing data to the volatile memory 220. In some examples, the non-volatile memory 225 may have a smaller page size than the volatile memory 220, as described herein.

The volatile memory 220 may be configured to operate as a cache for one or more components, such as the non-volatile memory 225. For example, the volatile memory 220 may store information (e.g., data) for the electronic device that includes the system 200. Accordingly, the volatile memory 220 may include an array or arrays of memory cells and a local memory controller configured to operate the array(s) of memory cells. In some examples, the memory cells may be or include DRAM cells (e.g., the volatile memory may be DRAM). The non-volatile memory 225 may be configured to interface with the interface controller 215 using the first protocol that is used between the interface controller 215 and the host device 205.

In some examples, the volatile memory 220 may have a shorter latency for access operations than the non-volatile memory 225. For example, retrieving data from the volatile memory 220 may take less time than retrieving data from the non-volatile memory 225. Similarly, writing data to the volatile memory 220 may take less time than writing data to the non-volatile memory 225. In some examples, the volatile memory 220 may have a larger page size than the non-volatile memory 225. For instance, the page size of volatile memory 220 may be 2 kilobytes (2 kB) and the page size of non-volatile memory 225 may be 64 bytes (64 B) or 128 bytes (128 B).

Although the non-volatile memory 225 may be a higher-density memory than the volatile memory 220, accessing the non-volatile memory 225 may take longer than accessing the volatile memory 220 (e.g., due to different architectures and protocols, among other reasons). Accordingly, operating the volatile memory 220 as a cache may reduce latency in the system 200. As an example, an access request for data from the host device 205 may be satisfied relatively quickly by retrieving the data from the volatile memory 220 rather than from the non-volatile memory 225. To facilitate operation of the volatile memory 220 as a cache, the interface controller 215 may include multiple buffers 235. The buffers 235 may be disposed on the same die as the interface controller 215 and may be configured to temporarily store data for transfer between the volatile memory 220, the non-volatile memory 225, or the host device 205 (or any combination thereof) during one or more access operations (e.g., storage and retrieval operations).

To store data in the memory subsystem 210, the host device 205 may initiate a write operation by transmitting a write command (also referred to as a storage request, a storage command, or a write request) to the interface controller 215. The write command may target a set of non-volatile memory cells in the non-volatile memory 225. The host device 205 may also provide the data to be written to the set of non-volatile memory cells to the interface controller 215. The interface controller 215 may temporarily store the data in the buffer 235-a. After storing the data in the buffer 235-a, the interface controller 215 may transfer the data from the buffer 235-a to the volatile memory 220 or the non-volatile memory 225 or both. In write-through mode, the interface controller 215 may transfer the data to both the volatile memory 220 and the non-volatile memory 225. In write-back mode, the interface controller 215 may simply transfer the data to the volatile memory 220 (with the data being transferred to the non-volatile memory 225 during a later eviction process).

In either mode, the interface controller 215 may identify an appropriate set of one or more volatile memory cells in the volatile memory 220 for storing the data associated with the write command. To do so, the interface controller 215 may implement set-associative mapping in which each set of one or more non-volatile memory cells in the non-volatile memory 225 may be mapped to multiple sets (e.g., rows) of volatile memory cells in the volatile memory 220. For instance, the interface controller 215 may implement n-way associative mapping which allows data from a set of non-volatile memory cells to be stored in one of n sets of volatile memory cells in the volatile memory 220. Thus, the interface controller 215 may manage the volatile memory 220 as a cache for the non-volatile memory 225 by referencing the n sets of volatile memory cells associated with a targeted set of non-volatile memory cells. Although described with reference to set-associative mapping, the interface controller 215 may manage the volatile memory 220 as a cache by implementing one or more other types of mapping such as direct mapping or associative mapping, among other examples.

After determining which n sets of volatile memory cells are associated with the targeted set of non-volatile memory cells, the interface controller 215 may store the data in one or more of the n sets of volatile memory cells. This way, a subsequent (e.g., following) read command from the host device 205 for the data can be efficiently satisfied by retrieving the data from the lower-latency volatile memory 220 instead of retrieving the data from the higher-latency non-volatile memory 225. The interface controller 215 may determine which of the n sets of the volatile memory 220 store the data based on or in response to one or more parameters associated with the data stored in the n sets of the volatile memory 220, such as the validity, age, or modification status of the data. Thus, a write command by the host device 205 may be wholly (e.g., in write-back mode) or partially (e.g., in write-through mode) satisfied by storing the data in the volatile memory 220. To track the data stored in the volatile memory 220, the interface controller 215 may store for one or more sets of volatile memory cells (e.g., for each set of volatile memory cells) a tag address that indicates the non-volatile memory cells with data stored in a given set of volatile memory cells.

To retrieve data from the memory subsystem 210, the host device 205 may initiate a read operation by transmitting a read command (also referred to as a retrieval request, a retrieval command, or a read request) to the interface controller 215. The read command may target a set of one or more non-volatile memory cells in the non-volatile memory 225. Upon receiving the read command, the interface controller 215 may check for the requested data in the volatile memory 220. For instance, the interface controller 215 may check for the requested data in the n sets of volatile memory cells associated with the targeted set of non-volatile memory cells. If one of then sets of volatile memory cells stores the requested data (e.g., stores data for the targeted set of non-volatile memory cells), the interface controller 215 may transfer the data from the volatile memory 220 to the buffer 235-a (e.g., in response to determining whether or that one of the n sets of volatile memory cells stores the requested data, as described in FIGS. 4 and 5) so that it can be transmitted to the host device 205.

In general, the term "hit" may be used to refer to the scenario where the volatile memory 220 stores data targeted by the host device 205. If the n sets of one or more volatile memory cells do not store the requested data (e.g., the n sets of volatile memory cells store data for a set of non-volatile memory cells other than the targeted set of non-volatile memory cells), the interface controller 215 may transfer the requested data from the non-volatile memory 225 to the buffer 235-a (e.g., in response to determining whether or that the n sets of volatile memory cells do not store the requested data, as described with reference to FIGS. 4 and 5) so that it can be transmitted to the host device 205. In general, the term "miss" may be used to refer to the scenario where the volatile memory 220 does not store data targeted by the host device 205.

In a miss scenario, after transferring the requested data to the buffer 235-a, the interface controller 215 may transfer the requested data from the buffer 235-a to the volatile memory 220 so that subsequent read requests for the data can be satisfied by the volatile memory 220 instead of the non-volatile memory 225. For example, the interface controller 215 may store the data in one of the n sets of volatile memory cells associated with the targeted set of non-volatile memory cells. But the n sets of volatile memory cells may already be storing data for other sets of non-volatile memory cells. So, to preserve this other data, the interface controller 215 may transfer the other data to the buffer 235-b so that it can be transferred to the non-volatile memory 225 for storage. Such a process may be referred to as "eviction" and the data transferred from the volatile memory 220 to the buffer 235-b may be referred to as "victim" data.

In some cases, the interface controller 215 may transfer a subset of the victim data from the buffer 235-b to the non-volatile memory 225. For example, the interface controller 215 may transfer one or more subsets of victim data that have changed since the data was initially stored in the non-volatile memory 225. Data that is inconsistent between the volatile memory 220 and the non-volatile memory 225 (e.g., due to an update in one memory and not the other) may be referred to in some cases as "modified" or "dirty" data. In some examples (e.g., if interface controller operates in one mode such as a write-back mode), dirty data may be data that is present in the volatile memory 220 but not present in the non-volatile memory 225.

So, the interface controller 215 may perform an eviction procedure to save data from the volatile memory 220 to the non-volatile memory 225 if the volatile memory 220 is full (e.g., to make space for new data in the volatile memory 220). In some examples, the interface controller 215 may perform a "fill" procedure in which data from the non-volatile memory 225 is saved to the volatile memory 220. The interface controller 215 may perform a fill procedure in the event of a miss (e.g., to populate the volatile memory 220 with relevant data). For example, in the event of a read miss, which occurs if a read command from the host device 205 targets data stored in the non-volatile memory 225 instead of the volatile memory 220, the interface controller 215 may retrieve (from the non-volatile memory 225) the data requested by the read command and, in addition to returning the data to the host device, store the data in the volatile memory 220 (e.g., so that the data can be retrieved quickly in the future).

Thus, the memory subsystem 210 may satisfy (or "fulfill") requests (e.g., read commands, write commands) from the host device 205 using either the volatile memory 220 or the non-volatile memory 225, depending on the hit or miss status of the request. For example, in the event of a read miss, the read command from the host device 205 may be satisfied by the non-volatile memory 225, which means that the data returned from the host device 205 may originate from the non-volatile memory 225. And in the event of a read hit, the read command from the host device 205 may be satisfied by the volatile memory 220, which means that the data returned from the host device 205 may originate from the volatile memory 220. In some examples, the ratio of hits to misses ("hit-to-miss ratio") may be relatively high (e.g., the hit percentage (or "hit rate") may be around 85% whereas the miss percentage (or "miss rate") may be around 15%).

The volatile memory 220, the non-volatile memory 225, or both, may include memory cells that are each programmable to store different logic states (e.g., programmed to one of a set of two or more possible states). For example, a memory cell may be operable to store one bit of information at a time (e.g., a logic 0 or a logic 1). In some examples, a memory cell (e.g., a multi-level memory cell) may be operable to store more than one bit of information at a time (e.g., a logic 00, logic 01, logic 10, a logic 11). In some examples, the memory cells may be arranged in an array, such as a memory array 170 described with reference to FIG. 1. In some examples, the memory cells in the volatile memory 220 may store a charge representative of the programmable states in a capacitor. For instance, DRAM and similar architectures may include a capacitor that includes a dielectric material to store a charge representative of the programmable state. A memory cell may include a logic storage component, such as capacitor, and a switching component. The capacitor may be an example of a dielectric capacitor or a ferroelectric capacitor.

The volatile memory 220 may include one or more access lines (e.g., one or more word lines and one or more digit lines) arranged in a pattern, such as a grid-like pattern. An access line may be a conductive line coupled with a memory cell and may be used to perform access operations on the memory cell. In some examples, word lines may be referred to as row lines. In some examples, digit lines may be referred to as column lines or bit lines. References to access lines, row lines, column lines, word lines, digit lines, or bit lines, or their analogues, are interchangeable without loss of understanding or operation. Memory cells may be positioned at intersections of the word lines and the digit lines.

Operations such as reading and writing may be performed on the memory cells by activating or selecting access lines such as one or more of a word line or a digit line. By biasing a word line and a digit line (e.g., applying a voltage to the word line or the digit line), a single memory cell may be accessed at their intersection. The intersection of a word line and a digit line in either a two-dimensional or three-dimensional configuration may be referred to as an address of a memory cell. Accessing the memory cells in the volatile memory 220 may be controlled through a row decoder, a column decoder, or both. For example, a row decoder may receive a row address (e.g., from a local memory controller) and may activate a word line based on or in response to the received row address. A column decoder may receive a column address (e.g., from the local memory controller) and may activate a multiplexer, a sense component, or both, based on or in response to the received column address.

Selecting or deselecting the memory cell may be accomplished by activating or deactivating the switching component using a word line. The capacitor may be coupled with the digit line using the switching component. For example, the capacitor may be isolated from digit line if the switching component is deactivated, and the capacitor may be coupled with digit line if the switching component is activated.

A word line may be a conductive line in electronic communication with a memory cell that is used to perform access operations on the memory cell. In some architectures, the word line may be coupled with a gate of a switching component of a memory cell and may be operable to control the switching component of the memory cell. In some architectures, the word line may be coupled with a node of the capacitor of the memory cell and the memory cell may not include a switching component. A digit line may be a conductive line that connects the memory cell with a sense component. In some architectures, the memory cell may be selectively coupled with the digit line during portions of an access operation. For example, the word line and the switching component of the memory cell may be operable to couple and/or isolate the capacitor of the memory cell and the digit line. In some architectures, the memory cell may be coupled with the digit line.

A sense component may be operable to detect a state (e.g., a charge) stored on the capacitor of a memory cell and determine a logic state of the memory cell based on, in response to, or as a function of the stored state. A sense component may include one or more sense amplifiers to amplify or otherwise convert a signal resulting from accessing the memory cell. In some examples, a sense component may compare a signal detected from the memory cell to a reference signal (e.g., a reference voltage). The detected logic state of the memory cell may be provided as an output of the sense component and may indicate the detected logic state to another component of the memory subsystem 210.

A local memory controller may control the accessing of memory cells in the volatile memory 220 through the various components (e.g., row decoder(s), column decoder(s), sense component(s)). The local memory controller may be operable to receive one or more of commands or data from one or more different memory controllers (e.g., the interface controller 215), translate the commands or the data (or both) into information that can be used by the volatile memory 220, perform one or more operations on memory array(s) in the volatile memory 220, and communicate data from the volatile memory 220 to another component based on or in response to performing the one or more operations. The local memory controller may generate and control various voltages or currents used during the operation of the volatile memory 220.

The local memory controller may be operable to perform one or more access operations on one or more memory cells of the volatile memory 220. Examples of access operations may include a write operation, a read operation, a refresh operation, a precharge operation, or an activate operation, among others. In some examples, access operations may be performed by or otherwise coordinated by the local memory controller in response to various access commands (e.g., from a host device 105).

The memory subsystem 210 may implement the techniques described herein to improve the efficiency and latency of operations, such as sensing operations and storage operations. For example, the volatile memory 220 may use separate control signals to control multiplexers that are electrically disposed between memory cells in a row and sense components. Using separate controls signals for the multiplexers may allow the volatile memory 220 to access in parallel various combinations of memory cells that would otherwise be inaccessible (or only accessible at different times) using other techniques, such as those that rely on a single a single control signal.

Figure 3:
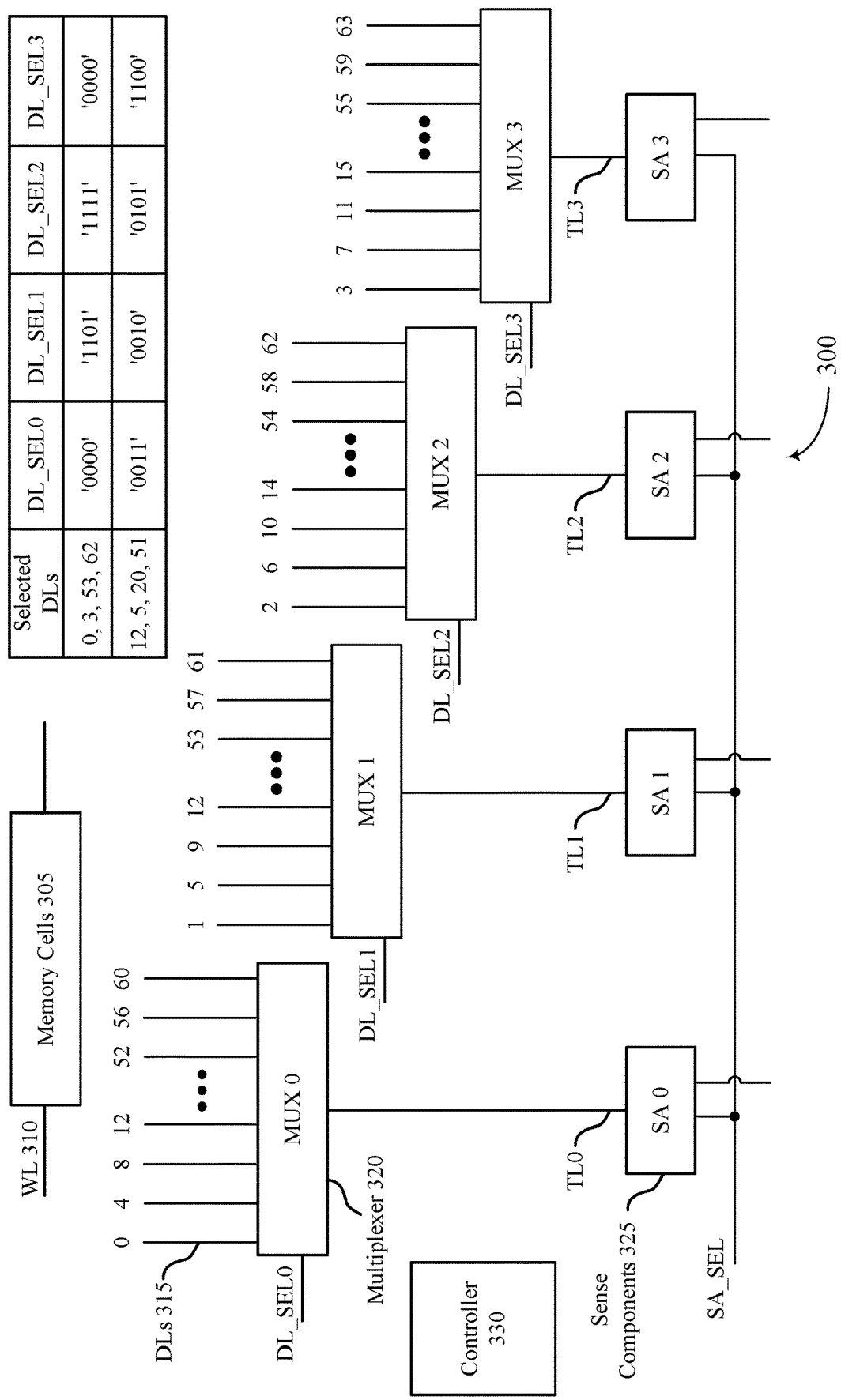
FIG. 3 illustrates an example of a device that supports programmable column access in accordance with examples as disclosed herein.

FIG. 3 illustrates an example of a device 300 that supports programmable column access in accordance with examples as disclosed herein. The device 300 may be an example of a system 100 or a memory device 110 as described with reference to FIG. 1 or the device 300 may be an example of a system 200, a memory subsystem 210, or a volatile memory 220 as described with reference to FIG. 2. The device 300 may include memory cells 305, which may be included in a memory array of the device. The memory cells 305 may be or include a row of memory cells that share (e.g., are coupled with) a common word line, such as the word line 310. Each memory cell in a row of the memory cells 305 may be coupled with a respective digit line 315, which may be associated with a respective column and may have a corresponding column address. The device 300 may also include multiplexers 320, each of which may be coupled with a respective (e.g., unique) subset of the memory cells 305. The device 300 may separately control the multiplexers 320 so that, relative to other techniques, more (and different) combinations of the digit lines (DLs) 315 can be accessed.

The configuration of the device 300 is for illustrative purposes only and is not limiting. Other configurations of the device 300 are contemplated and are within the scope of the present disclosure.

The device 300 may include sense components 325, which may be or include sense amplifiers (SAs) or other components capable of sensing and amplifying voltages on the digit lines 315. The sense components 325 may include SA 0 through SA. In some examples, the quantity of sense components 325 may be less than the quantity of digit lines for the row of memory cells 305. To ensure that each digit line can be sensed, each sense component 325 may be coupled with a corresponding multiplexer 320, which may be configured to selectively couple one of the digit lines 315 with the sense component 325 for that multiplexer 320.

In the illustrated example, a set of digit lines (e.g., sixty-four digit lines, 0 through 63) corresponding to a row is coupled with a set of multiplexers 320 (e.g., MUX 0 through MUX 3). For example, starting at digit line 0 (which may be associated with column address 0) every fourth digit line may be coupled with MUX 0. Starting at digit line 1 (which may be associated with column address 1) every fourth digit line may be coupled with MUX 1. Starting at digit line 2 (which may be associated with column address 2) every fourth digit line may be coupled with MUX 2. And starting at digit line 3 (which may be associated with column address 3) every fourth digit line may be coupled with MUX 3. If activated (e.g., by a control signal), a multiplexer 320 may couple a digit line 315 with a sense component 325 by establishing a conductive path between the digit line and the sense component 325. The other digit lines may remain isolated from the sense component 325. Thus, a multiplexer 320 may be used to couple one of x (e.g., x=16, 8, 32) digit lines 315 with a sense component 325.

The controller 330 may enable sensing (or other access, such as writing) by communicating control signals to the multiplexers 320. Thus, the controller 330 may be coupled with the multiplexers 320. In some examples, the controller 330 may control the multiplexers 320 collectively (e.g., as a unit) by communicating a single control signal to each of the multiplexers 320. The control signal may indicate the position of the digit line 315 selected for sensing. For example, the control signal may be a multi-bit control signal that indicates one of x positions for the digit lines. To illustrate, the control signal (denoted DL_SEL) may be a four-bit control signal that indicates one of sixteen positions. Continuing the illustration, the controller 330 may cause each of the multiplexers 320 to couple the digit line in the zero position by transmitting a control signal with binary value '0000.'

An example mapping of control signal values (in binary) to digit line positions and digit lines is illustrated in Table 1. Other mappings are contemplated and within the scope of the present disclosure.

TABLE 1

| DLs | 0-3 | 4-7 | 8-11 | 12-15 | 16-19 | ... | 44-47 | 48-51 | 52-55 | 56-59 | 60-63 |
|---|---|---|---|---|---|---|---|---|---|---|---|
| Position | 0 | 1 | 2 | 3 | 4 | ... | 11 | 12 | 13 | 14 | 15 |
| DL_SEL | 0000 | 0001 | 0010 | 0011 | 0100 | ... | 0111 | 1100 | 1101 | 1110 | 1111 |

Using a single control signal for the multiplexers 320 may allow the device 300 to access combinations of memory cells (e.g., contiguous memory cells, which may be memory cells with sequential column addresses), which may form a page. For example, continuing the forgoing example, the control signal with value '0000' may allow the device 300 to sense contiguous memory cells 0, 1, 2, and 3 using SA 0, SA 1, SA 2, and SA 3, respectively. However, use of a single control signal may limit the combinations of digit lines 315 that the device 300 can sense. For example, the device 300 may not be able to sense non-contiguous digit lines (e.g., digit line 0, digit line 3, digit line 53, and digit line 62) without performing multiple (e.g., four) sensing operations (e.g., because the voltages on the digit lines 315 may be disturbed by the sensing operations). That is, the device 300 may activate the word line 310 and the sense components 325 multiple times to sense non-contiguous digit lines 315, which may take time and consume excess power.

To sense additional (e.g., non-contiguous) combinations of digit lines, the controller 330 may use separate (e.g., unique) control signals for the multiplexers 320. For example, the controller 330 may use a first control signal (denoted DL_SEL0) to control the operations of MUX 0, may use a second control signal (denoted DL_SEL1) to control the operations of MUX 1, may use a third control signal (denoted DL_SEL2) to control the operations of MUX 2, and may use a fourth control signal (denoted DL_SEL3) to control the operations of MUX 3. Thus, the device 300 may sense digit lines 0, 3, 53, and 62 in parallel (e.g., concurrently, at the same time, at partially overlapping times). To do so, the controller 330 may communicate DL_SEL0='0000' to MUX 0 so that MUX 0 couples digit line 0 with SA 0, may communicate DL_SEL1='1101' to MUX 1 so that MUX 1 couples digit line 53 with SA 1, may communicate DL_SEL2='1111' to MUX 2 so that MUX 2 couples digit line 62 with SA 2, and may communicate DL_SEL3='0000' to MUX 3 so that MUX 3 couples digit line 3 with SA 3.

As another example, the device 300 may sense digit lines 12, 5, 20, and 51 in parallel by communicating DL_SEL0='0011' to MUX 0 so that MUX 0 couples digit line 12 with SA 0, communicating DL_SEL1='0010' to MUX 1 so that MUX 1 couples digit line 5 with SA 1, communicating DL_SEL2='0101' to MUX 2 so that MUX 2 couples digit line 20 with SA 2, and communicating DL_SEL3='1100' to MUX 3 so that MUX 3 couples digit line 51 with SA 3. Because the digit lines 315 are coupled with the sense components 325 in parallel, the device 300 may sense multiple non-contiguous digit lines 315 without activating the word line 310 and the sense components 325 multiple times, which may increase the efficiency of sensing.

The selected digit lines 315 may be coupled with the sense components 325 via transmission lines, such as transmission lines TL0 through TL3. Coupling the digit lines with the sense components 325 may enable the transfer of voltage from the digit lines to the sense components 325, which may sense, amplify, and latch the voltages. The device 300 may select one or more of the sense components 325 to output the latched voltages (which may also be referred to as data bits, values, or other suitable terminology) by communicating a control signal (denoted SA_SEL) to the sense components 325. In some examples, the control signal SA_SEL may indicate a column address.

Although described with reference to sensing operations, the techniques described herein may be implemented for other types of operations, such as storage operations. In such examples, the sense components 325 may be input/output (I/O) components that are capable of capable of both reading and writing the memory cells 305.

Figure 4:
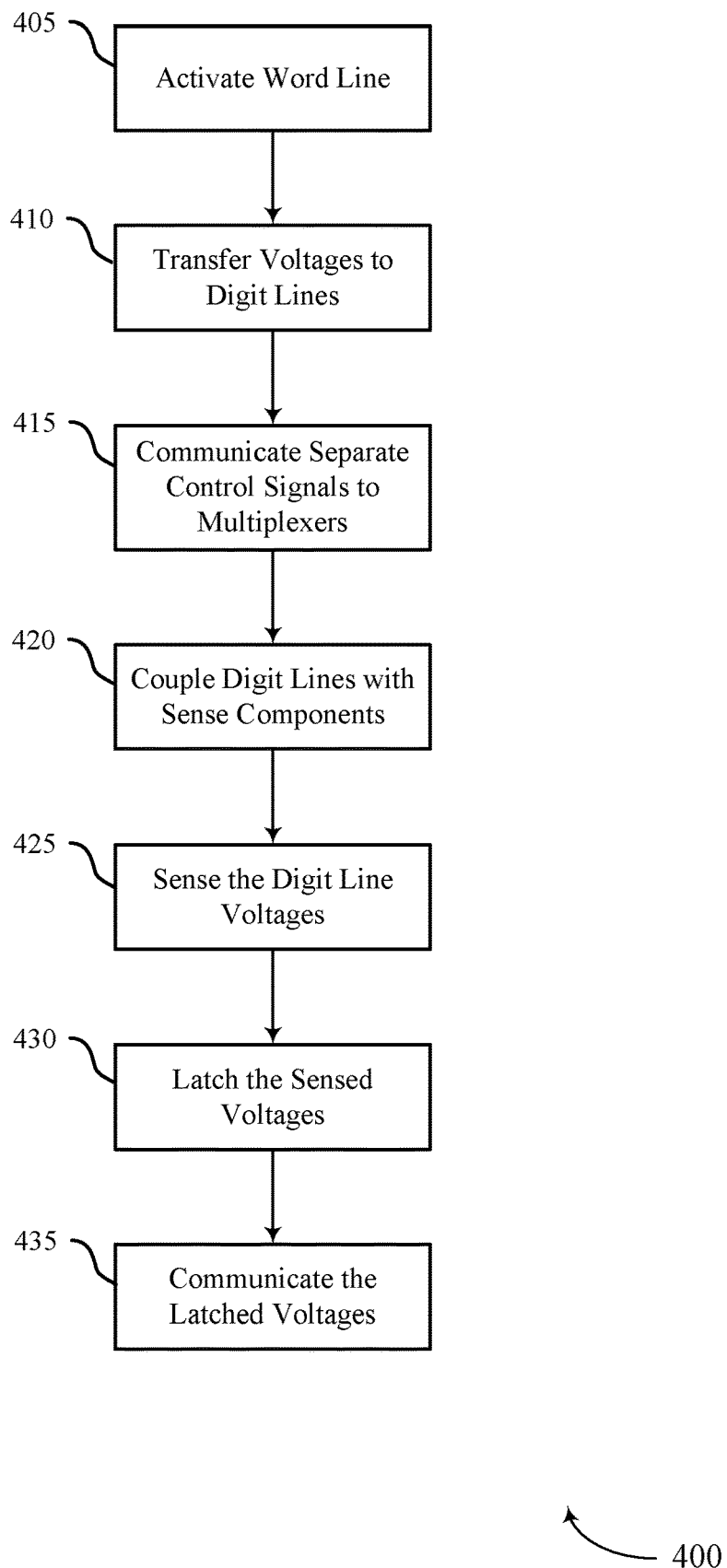
FIG. 4 illustrates an example of a process flow that supports programmable column access in accordance with examples as disclosed herein.

FIG. 4 illustrates an example of a process flow 400 that supports programmable column access in accordance with examples as disclosed herein. The process flow 400 may be implemented by a system 100, a memory device 110, a system 200, a memory subsystem 210, or a device 300 as described with reference to FIGS. 1 through 3. However, other types of devices or components may implement process flow 400. The process flow 400 may illustrate the operations of a device that uses separate controls signals to enable programmable column access.

For ease of reference, the process flow 400 is described with reference to a device. For example, aspects of the process flow 400 may be implemented by a device that includes one or more types of memory such as a volatile memory, a non-volatile memory, or both, among other configurations. Additionally or alternatively, aspects of the process flow 400 may be implemented as instructions stored in memory (e.g., firmware stored in the device). For example, the instructions, if executed by a controller, may cause the controller to perform the operations of the process flow 400.

At 405, a word line may be activated. For example, the device 300 may activate a word line (e.g., word line 310) for a row of memory cells. The device 300 may activate the word line based on or in response to an activate command that indicates address information for the memory cells, such as the row address, one or more column addresses, a value for a DL_SEL control signal, or a combination thereof. In some examples, the address indicated for activation by a command may be referred to as an activate address or an active address.

At 410, voltages stored at the memory cells in the row may be transferred to (e.g., developed on) respective digit lines for the memory cells. For example, voltages indicative of logic states stored at the memory cells 305 may be transferred the digit lines 315. The voltages may be transferred to the digit lines based on or in response to activating the word line at 405.

At 415, separate (e.g., respective) control signals may be communicated to multiplexers. For example, the controller 330 may communicate a respective control signal DL_SEL to each of the multiplexers 320. As an illustration, the controller 330 may communicate DL_SEL0='0000' to MUX 0, may communicate DL_SEL1='1101' to MUX 1, may communicate DL_SEL2='1111' to MUX 2, and may communicate DL_SEL3='0000' to MUX 3. The control signals may be communicated at different times, at partially overlapping times, or at wholly overlapping times. The values of the control signals may be based on, in response to, or a function of address information received from the host device (e.g., in the activate command or another command).

At 420, digit lines may be coupled with sense components. For example, the multiplexers 320 may couple a subset of the digit lines 315 with the sense components 325. The digit lines coupled with the sense components may be selected based on or in response to the control signals communicated at 415. As an illustration, MUX 0 may couple digit line 0 with SA 0, MUX 1 may couple digit line 53 with SA 1, MUX 2 may couple digit line 62 with SA 2, and MUX 3 may couple digit line 3 with SA 3. Coupling a digit line with a sense component may refer to establishment of a conductive path between the digit line and the sense component so that charge (e.g., current, voltage) can be transferred from the digit line to the sense component.

At 425, digit lines voltages may be sensed. For example, the sense components 325 may be activated so that the voltages from the digit lines may be sensed (e.g., compared with reference voltages and amplified) by the sense components. As an illustration, SA 0 may sense the voltage from digit line 0, SA 1 may sense the voltage from digit line 53, SA 2 may sense the voltage from digit line 62, and SA 3 may sense the voltage from digit line 3. The sensed voltages may be representative of logic states stored by the memory cells coupled with the digit lines. At 430, the sensed values may be latched. For example, the sense components 325 may latch (e.g., store) the voltages sensed at 430. At 435, the latched voltages may be communicated. For example, the sense components 325 may output the latched voltages to one or more other components of the device 300, which may then communicate the latched voltages as data bit values to another internal or external device (e.g., a host device).

Thus, multiple non-contiguous memory cells may be sensed in parallel and without activating the word line and sense components multiple times. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 5:
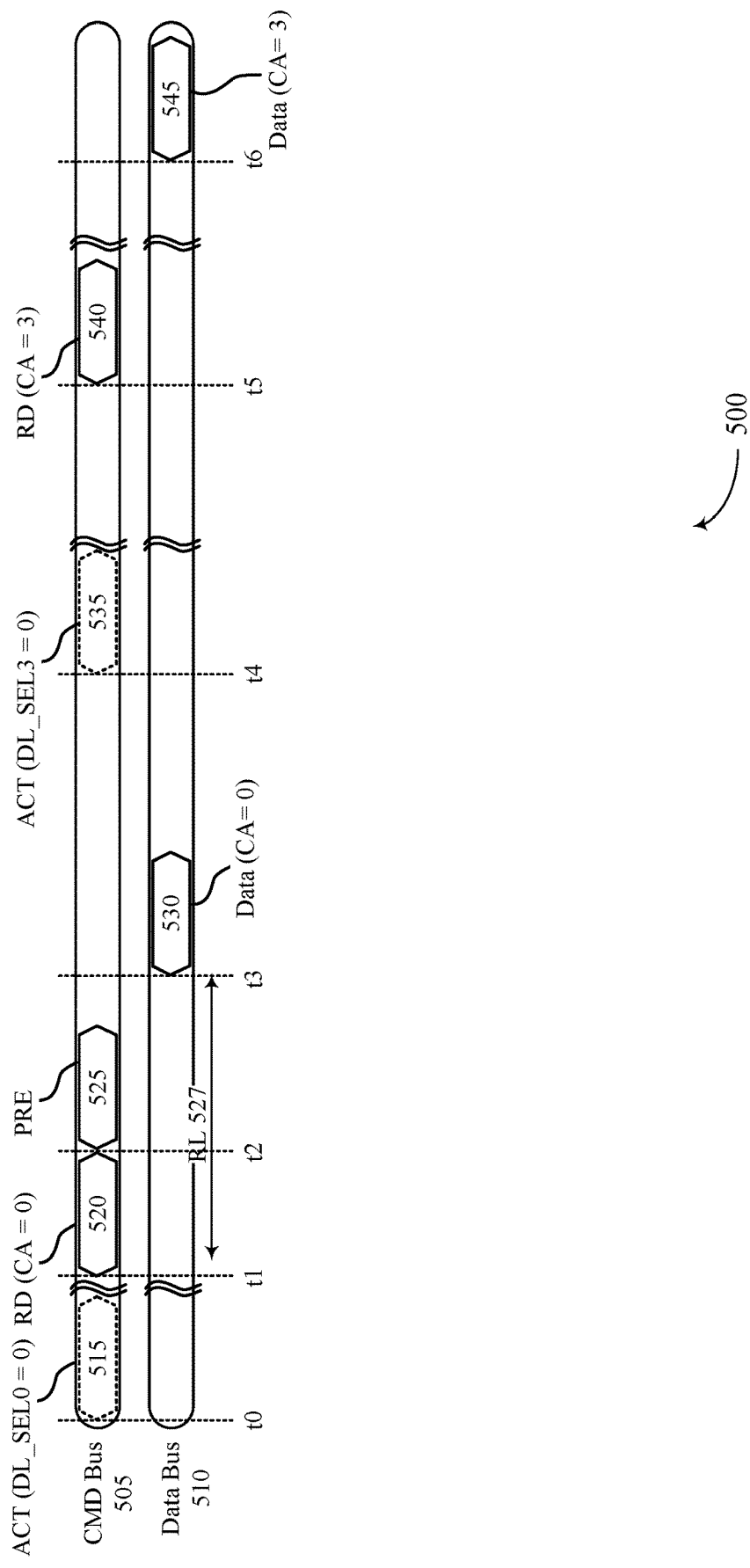
FIG. 5 illustrates an example of a timing diagram that supports programmable column access in accordance with examples as disclosed herein.

FIG. 5 illustrates an example of a timing diagram 500 that supports programmable column access in accordance with examples as disclosed herein. The timing diagram 500 may illustrate commands that are received (e.g., from a host device) over a command (CMD) bus 505 data that is communicated over a data bus 510. The timing diagram 500 may support the use of separate control signals for multiplexers as described herein. The timing diagram 500 may be backwards-compatible with various architectures, such as DRAM, among others. In the timing diagram 500, the activate commands may be separated by a precharge command and a read command. In some examples, one or both of the activate commands may be omitted from the timing diagram 500.

At time t0, a command, such as activate (ACT) command 515, may be received. The activate command 515 may indicate a value for a control signal for a first multiplexer. For example, the activate command 515 may indicate a value (e.g., binary '0000,' decimal 0) for DL_SEL0. The activate command 515 may explicitly indicate the value for the first control signal (e.g., one or more bits) or may implicitly indicate the value for the first control signal (e.g., via address information).

At time t1, a command, such as read (RD) command 520 may be received. The read command 520 may indicate a column address (e.g., CA=0) to be read (e.g., sensed, latched, and communicated). At t2, a command, such as precharge command 525, may be received. The precharge command 525 may indicate that the device is to precharge the digit lines associated with the address information indicated by the activate command 515, the read command 520, or both. At time t3, after read latency 527 (which is relative to time t1) has elapsed, data 530 from the memory cell associated with CA=0 (e.g., the memory cell coupled with digit line 0) may be sent over the data bus 510. The device may obtain the data 530 by activating the row indicated by the activate command 515, coupling digit line 0 with MUX 0 using DL_SEL0='0000,' sensing the voltage from digit line 0, and latching the sensed voltage from digit line 0.

At time t4, a command, such as activate (ACT) command 535, may be received. The activate command 535 may indicate a value for a control signal for a second multiplexer. For example, the activate command 535 may indicate a value (e.g., binary '0000,' decimal 0) for DL_SEL3. The activate command 535 may explicitly indicate the value for the second control signal (e.g., one or more bits) or may implicitly indicate the value for the second control signal (e.g., via address information). At time t5, a command, such as read (RD) command 540 may be received. The read command 540 may indicate a column address (e.g., CA=3) to be read (e.g., sensed, latched, and communicated). At time t6, data 545 from the memory cell associated with CA=3 (e.g., the memory cell coupled with digit line 3) may be sent over the data bus 510. The device may obtain the data 545 by activating the row indicated by the activate command 535, coupling digit line 3 with MUX 3 using DL_SEL3='0000,' sensing the voltage from digit line 3, and latching the sensed voltage from digit line 3.

Figure 6:
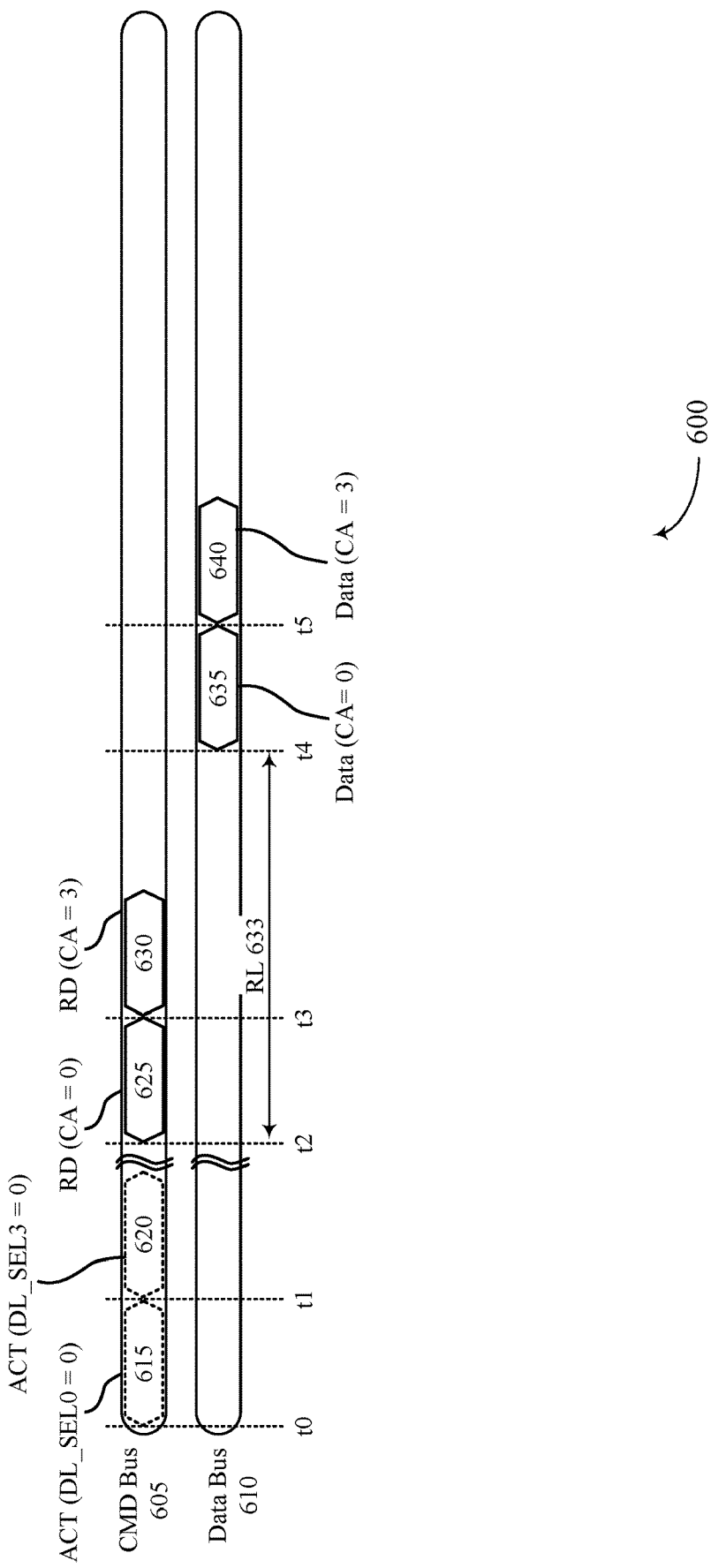
FIG. 6 illustrates an example of a timing diagram that supports programmable column access in accordance with examples as disclosed herein.

FIG. 6 illustrates an example of a timing diagram 600 that supports programmable column access in accordance with examples as disclosed herein. The timing diagram 600 may illustrate commands that are received (e.g., from a host device) over a command (CMD) bus 605 data that is communicated over a data bus 610. The timing diagram 600 may support the use of separate control signals for multiplexers as described herein. The timing diagram 600 may be compatible with various emerging memory architectures, which may or may not have destructive read operations. In the timing diagram 600, the activate commands may be consecutive (e.g., free of intervening commands, such as read commands, precharge commands) and the read commands may be consecutive (e.g., free of intervening commands, such as activate commands, precharge commands). Consecutive activate commands, read commands, or both, may reduce the latency of sensing. In some examples, one or both of the activate commands may be omitted from the timing diagram 600.

At time t0, a command, such as activate (ACT) command 615, may be received. The activate command 615 may indicate a value for a control signal for a first multiplexer. For example, the activate command 615 may indicate a value (e.g., binary '0000,' decimal 0) for DL_SEL0. The activate command 615 may explicitly indicate the value for the first control signal (e.g., one or more bits) or may implicitly indicate the value for the first control signal (e.g., via address information).

At time t1, a command, such as activate (ACT) command 620, may be received. The activate command 620 may be the next command issued after the activate command 615. Thus, the activate command 615 and the activate command 620 may be consecutive (e.g., the activate commands may not be separated by other commands). The activate command 620 may indicate a value for a control signal for a second multiplexer. For example, the activate command 620 may indicate a value (e.g., binary '0000,' decimal 0) for DL_SEL3. The activate command 620 may explicitly indicate the value for the second control signal (e.g., one or more bits) or may implicitly indicate the value for the second control signal (e.g., via address information).

At time t2, a command, such as read (RD) command 625 may be received. The read command 625 may indicate a column address (e.g., CA=0) to be read (e.g., sensed, latched, and communicated). At time t3, a command, such as read (RD) command 630 may be received. The read command 630 may be the next command issued after the read command 625. Thus, the read command 625 and the read command 630 may be consecutive (e.g., the read commands may not be separated by other commands). The read command 630 may indicate a column address (e.g., CA=3) to be read (e.g., sensed, latched, and communicated).

At time t4, after read latency 633 (which is relative to time t2) has elapsed, data 635 from the memory cell associated with CA=0 (e.g., the memory cell coupled with digit line 0) may be sent over the data bus 610. The device may obtain the data 635 by activating the row indicated by the activate command 615, coupling digit line 0 with MUX 0 using DL_SEL0='0000,' sensing the voltage from digit line 0, and latching the sensed voltage from digit line 0. At time t5, data 640 from the memory cell associated with CA=3 (e.g., the memory cell coupled with digit line 3) may be sent over the data bus 610. Because the row has already been activated, the device may obtain the data 640 by coupling digit line 3 with MUX 3 using DL_SEL3='0000,' sensing the voltage from digit line 3, and latching the sensed voltage from digit line 3. Thus, the techniques described herein may allow the device to avoid activating the row twice, which may save time and power, among other advantages.

Figure 7:
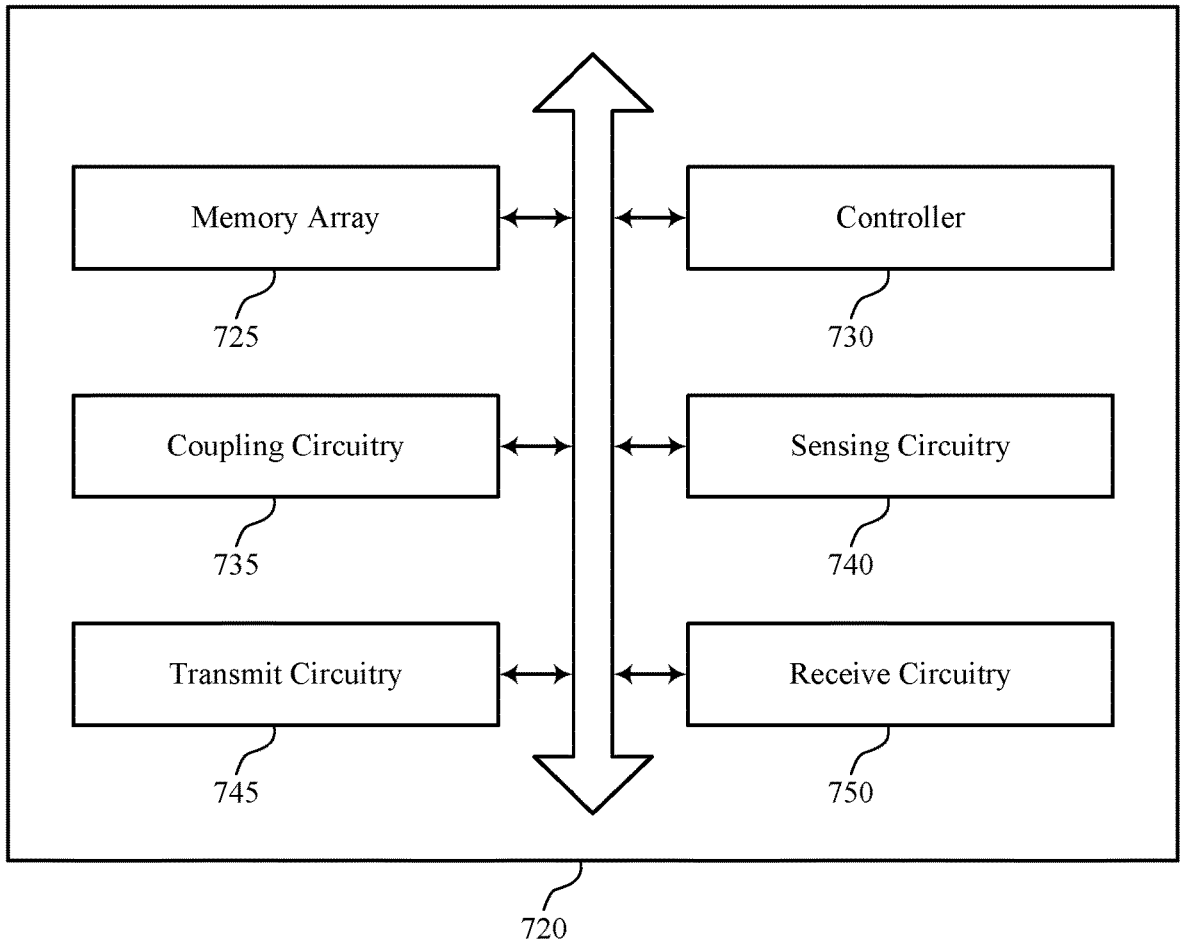
FIG. 7 shows a block diagram of a device that supports programmable column access in accordance with examples as disclosed herein.

FIG. 7 shows a block diagram 700 of a device 720 that supports programmable column access in accordance with examples as disclosed herein. The device 720 may be an example of aspects of a system, memory subsystem, or device as described with reference to FIGS. 1 through 6. The device 720, or various components thereof, may be an example of means for performing various aspects of programmable column access as described herein. For example, the device 720 may include a memory array 725, a controller 730, a coupling circuitry 735, a sensing circuitry 740, a transmit circuitry 745, a receive circuitry 750, or any combination thereof. Each of these components may communicate, directly or indirectly, with one another (e.g., via one or more buses).

The memory array 725 may be configured as or otherwise support a means for transferring voltages from memory cells of a row in a memory array to respective digit lines for the memory cells, the voltages indicative of logic values stored at the memory cells. The controller 730 may be configured as or otherwise support a means for communicating respective control signals to a set of multiplexers coupled with the digit lines, where each multiplexer is coupled with a respective subset of the digit lines. The coupling circuitry 735 may be configured as or otherwise support a means for coupling, by each multiplexer and based at least in part on the respective control signal for that multiplexer, a digit line of the respective subset of digit lines with a respective sense component for that multiplexer.

In some examples, coupling comprises coupling a set of the digit lines with a set of sense components. In some examples, the sensing circuitry 740 may be configured as or otherwise support a means for sensing a respective logic state at each sense component of the sense components based at least in part on coupling the set of digit lines with the set of sense components. In some examples, the set of digit lines includes digit lines associated with non-sequential column addresses.

In some examples, to support communicating respective control signals, the controller 730 may be configured as or otherwise support a means for communicating a first control signal to a first multiplexer of the set of multiplexers, the first control signal having a first value. In some examples, to support communicating respective control signals, the controller 730 may be configured as or otherwise support a means for communicating a second control signal to a second multiplexer of the set of multiplexers, the second control signal having a second value different than the first value. In some examples, the first and second control signals are communicated concurrently.

In some examples, to support communicating respective control signals, the controller 730 may be configured as or otherwise support a means for communicating a third control signal to a third multiplexer of the set of multiplexers, the third control signal having a third value different than at least one of the first value or the second value.

In some examples, the controller 730 may be configured as or otherwise support a means for communicating a first control signal to a set of sense components including the respective sense components for each multiplexer. In some examples, the transmit circuitry 745 may be configured as or otherwise support a means for communicating a logic value sensed by a sense component of the set of sense components based at least in part on the first control signal. In some examples, each subset of digit lines includes a unique plurality of digit lines associated with non-sequential column addresses.

In some examples, coupling comprises coupling a first digit line (e.g., digit line 0) with a first sense component (e.g., MUX 0). In some examples, the receive circuitry 750 may be configured as or otherwise support a means for receiving, consecutively after a first activate address (or a first activate command) for the first digit line, a second activate address (or a second activate command) for a second digit line of the row. In some examples, the coupling circuitry 735 may be configured as or otherwise support a means for coupling the second digit line (e.g., digit line 3) with a second sense component (e.g., MUX 3) based at least in part on the second activate address (or the second activate command). In some examples, the transmit circuitry 745 may be configured as or otherwise support a means for communicating, over a data bus, a first logic value associated with the first digit line and a second logic value associated with the second digit line.

In some examples, the receive circuitry 750 may be configured as or otherwise support a means for receiving, consecutively after a first read command for the first digit line (e.g., read command 625 for digit line 0), a second read command for the second digit line (e.g., read command 630 for digit line 3), where the first and second logic values are communicated based at least in part on receiving the first and second read commands.

In some examples, the control signals include a first control signal for a first multiplexer that is based at least in part on the first activate address (or the first activate command), and the controller 730 may be configured as or otherwise support a means for communicating a second control signal to a second multiplexer based at least in part on the second activate address (or the second activate command), where the second digit line is coupled with the second sense component based at least in part on the second control signal.

Figure 8:
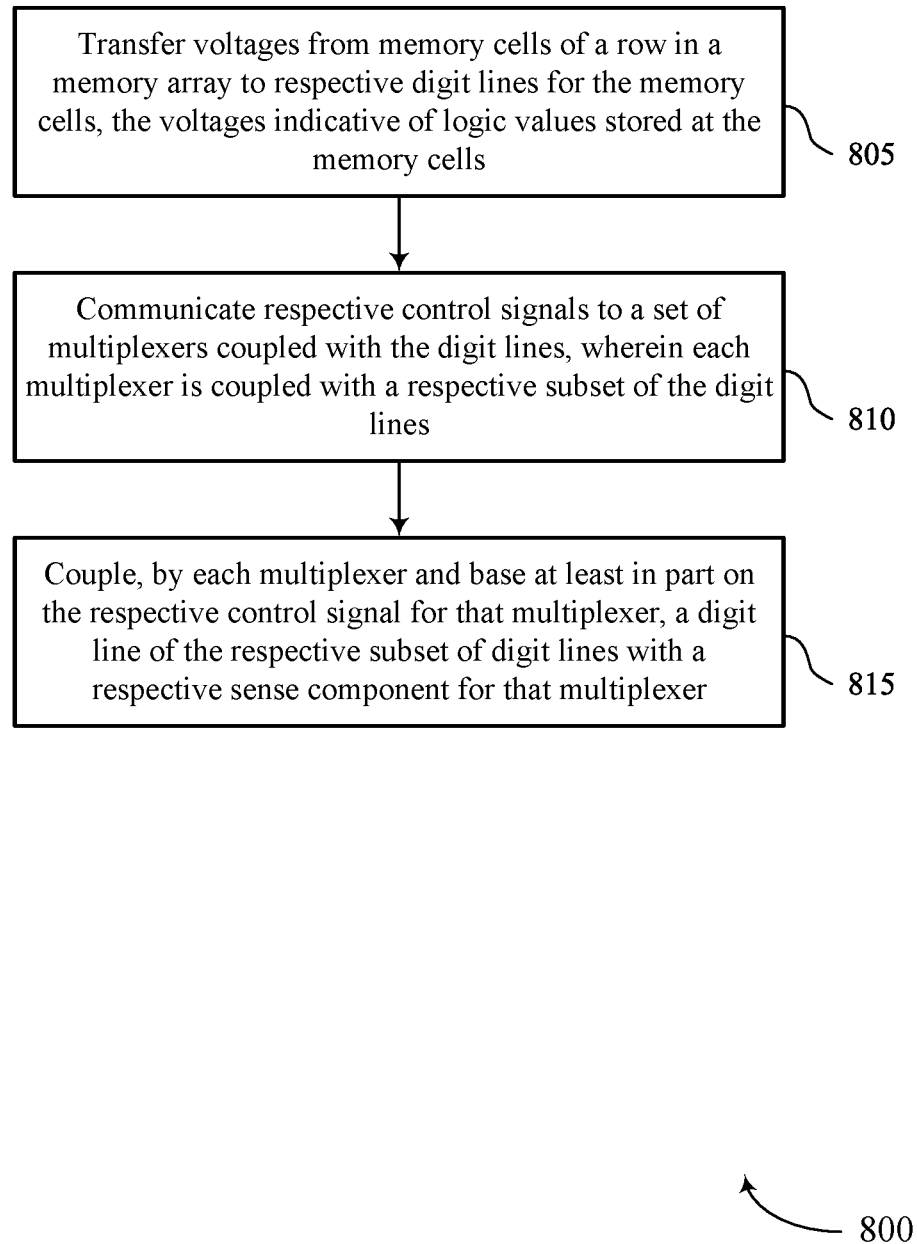
FIG. 8 shows a flowchart illustrating a method or methods that support programmable column access in accordance with examples as disclosed herein.

FIG. 8 shows a flowchart illustrating a method 800 that supports programmable column access in accordance with examples as disclosed herein. The operations of method 800 may be implemented by a system, memory subsystem, or a device or its components as described herein. For example, the operations of method 800 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 805, the method may include transferring voltages from memory cells of a row in a memory array to respective digit lines for the memory cells, the voltages indicative of logic values stored at the memory cells. The operations of 805 may be performed in accordance with examples as disclosed herein. In some examples, aspects of the operations of 805 may be performed by a memory array 725 as described with reference to FIG. 7.

At 810, the method may include communicating respective control signals to a set of multiplexers coupled with the digit lines, where each multiplexer is coupled with a respective subset of the digit lines. The operations of 810 may be performed in accordance with examples as disclosed herein. In some examples, aspects of the operations of 810 may be performed by a controller 730 as described with reference to FIG. 7.

At 815, the method may include coupling, by each multiplexer and based at least in part on the respective control signal for that multiplexer, a digit line of the respective subset of digit lines with a respective sense component for that multiplexer. The operations of 815 may be performed in accordance with examples as disclosed herein. In some examples, aspects of the operations of 815 may be performed by a coupling circuitry 735 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for transferring voltages from memory cells of a row in a memory array to respective digit lines for the memory cells, the voltages indicative of logic values stored at the memory cells, communicating respective control signals to a set of multiplexers coupled with the digit lines, where each multiplexer is coupled with a respective subset of the digit lines, and coupling, by each multiplexer and based at least in part on the respective control signal for that multiplexer, a digit line of the respective subset of digit lines with a respective sense component for that multiplexer.

In some examples of the method 800 and the apparatus described herein, and the method, apparatuses, and non-transitory computer-readable medium may include further operations, features, circuitry, logic, means, or instructions for sensing a respective logic state at each sense component of the sense components based at least in part on coupling the set of digit lines with the set of sense components.

In some examples of the method 800 and the apparatus described herein, the set of digit lines includes digit lines associated with non-sequential column addresses.

In some examples of the method 800 and the apparatus described herein, communicating respective control signals may include operations, features, circuitry, logic, means, or instructions for communicating a first control signal to a first multiplexer of the set of multiplexers, the first control signal having a first value and communicating a second control signal to a second multiplexer of the set of multiplexers, the second control signal having a second value different than the first value. In some examples of the method 800 and the apparatus described herein, the first and second control signals may be communicated concurrently.

In some examples of the method 800 and the apparatus described herein, communicating respective control signals may include operations, features, circuitry, logic, means, or instructions for communicating a third control signal to a third multiplexer of the set of multiplexers, the third control signal having a third value different than at least one of the first value or the second value.

Some examples of the method 800 and the apparatus described herein may further include operations, features, circuitry, logic, means, or instructions for communicating a first control signal to a set of sense components including the respective sense components for each multiplexer and communicating a logic value sensed by a sense component of the set of sense components based at least in part on the first control signal. In some examples of the method 800 and the apparatus described herein, each subset of digit lines includes a unique plurality of digit lines associated with non-sequential column addresses.

In some examples of the method 800 and the apparatus described herein, and the method, apparatuses, and non-transitory computer-readable medium may include further operations, features, circuitry, logic, means, or instructions for receiving, consecutively after a first activate address (or a first activate command) for the first digit line, a second activate address (or a second activate command) for a second digit line of the row, coupling the second digit line with a second sense component based at least in part on the second activate address (or the second activate command), and communicating, over a data bus, a first logic value associated with the first digit line and a second logic value associated with the second digit line.

Some examples of the method 800 and the apparatus described herein may further include operations, features, circuitry, logic, means, or instructions for receiving, consecutively after a first read command for the first digit line, a second read command for the second digit line, where the first and second logic values may be communicated based at least in part on receiving the first and second read commands.

In some examples of the method 800 and the apparatus described herein, the control signals include a first control signal for a first multiplexer that may be based at least in part on the first activate address (or the first activate command) and the method, apparatuses, and non-transitory computer-readable medium may include further operations, features, circuitry, logic, means, or instructions for communicating a second control signal to a second multiplexer based at least in part on the second activate address (or the second activate command), where the second digit line may be coupled with the second sense component based at least in part on the second control signal.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array including a row of memory cells coupled with respective digit lines, a controller coupled with the memory array and configured to communicate a set of respective control signals to a set of multiplexers coupled with the digit lines, a first multiplexer, of the set of multiplexers, that is coupled with the controller and a first subset of the digit lines, the first multiplexer configured to couple a first digit line of the first subset of digit lines with a first sense component based at least in part on a first control signal of the set of respective control signals, and a second multiplexer, of the set of multiplexers, coupled with the controller and a second subset of the digit lines, the second multiplexer configured to couple a second digit line of the second subset of digit lines with a second sense component based at least in part on a second control signal of the set of respective control signals.

In some examples of the apparatus, the first sense component may be configured to sense a first logic state associated with the first digit line and the second sense component may be configured to sense a second logic state associated with the second digit line.

In some examples of the apparatus, the first control signal may have a first value and the second control signal may have a second value different than the first value.

In some examples of the apparatus, the controller may be configured to communicate the first and second control signals concurrently.

In some examples, the apparatus may include a third multiplexer coupled with a third subset of the digit lines, the third multiplexer configured to couple a third digit line of the third subset with a third sense component based at least in part on a third control signal of the set of control signals.

Another apparatus is described. The apparatus may include a memory array including a row of memory cells coupled with a set of multiplexers and a controller coupled with the memory array and the set of multiplexers, the controller operable to cause the apparatus to transfer voltages from memory cells of a row in a memory array to respective digit lines for the memory cells, the voltages indicative of logic values stored at the memory cells, communicate respective control signals to the set of multiplexers, where each multiplexer is coupled with a respective subset of the digit lines, and couple, by each multiplexer and based at least in part on the control signal for that multiplexer, a digit line of the respective subset of digit lines with a sense component for that multiplexer.

In some examples, the apparatus may include a set of sense components including a sense component for each multiplexer, the set of sense components configured to sense logic values associated with the digit lines. In some examples of the apparatus, the respective control signals include a first control signal communicated to a first multiplexer of the set of multiplexers and a second control signal communicated to a second multiplexer of the set of multiplexers.

In some examples of the apparatus, the first control signal may have a first value and the second control signal may have a second value different than the first value. In some examples of the apparatus, the controller may be configured to communicate the respective control signals concurrently. In some examples of the apparatus, the respective control signals include a third control signal communicated to a third multiplexer of the set of multiplexers and a fourth control signal communicated to a fourth multiplexer of the set of multiplexers.

In some examples, the apparatus may include receive, consecutively after a first activate address (or first activate command) for the first digit line, a second activate address (or second activate command) for a second digit line of the row, couple the second digit line with a second sense component based at least in part on the second activate address (or second activate command), and communicate over a data bus a first logic value associated with the first digit line and a second logic value associated with the second digit line. In some examples, the apparatus may include receive, consecutively after a first read command for the first digit line, a second read command for the second digit line, where the first and second logic values may be communicated based at least in part on receiving the first and second read commands.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method by a memory device, comprising:
   transferring voltages from memory cells of a row in a memory array to respective digit lines for the memory cells, the voltages indicative of logic values stored at the memory cells;
   communicating respective control signals concurrently to each respective multiplexer via a single selection line associated with the respective multiplexer of a set of multiplexers coupled with the digit lines, wherein each multiplexer is coupled with a respective subset of the digit lines and wherein each respective control signal is received at the respective multiplexer via the respective single selection line and comprises a numerical bit sequence indicating a single digit line of the respective subset of the digit lines based on each digit line of the respective subset of the digit lines being associated with a respective numerical bit sequence; and
   coupling, concurrently by each multiplexer and based on the numerical bit sequence of the respective control signal for that multiplexer, a digit line of the respective subset of digit lines with a respective sense component for that multiplexer.

2. The method of claim 1, wherein coupling comprises coupling a set of the digit lines with a set of sense components, the method further comprising:
   sensing a respective logic state at each sense component of the set of sense components based on coupling the set of the digit lines with the set of sense components.

3. The method of claim 2, wherein the set of the digit lines comprises digit lines associated with non-sequential column addresses.

4. The method of claim 1, wherein communicating respective control signals comprises:
communicating a first control signal to a first multiplexer of the set of multiplexers, the first control signal having a first value; and
communicating a second control signal to a second multiplexer of the set of multiplexers, the second control signal having a second value different than the first value.

5. The method of claim 4, wherein the first control signal and the second control signal are communicated concurrently.

6. The method of claim 4, wherein communicating respective control signals comprises:
communicating a third control signal to a third multiplexer of the set of multiplexers, the third control signal having a third value different than at least one of the first value or the second value.

7. The method of claim 1, further comprising:
communicating a first control signal to a set of sense components comprising the respective sense components for each multiplexer; and
communicating a logic value sensed by a sense component of the set of sense components based on the first control signal.

8. The method of claim 1, wherein each subset of digit lines comprises a unique plurality of digit lines associated with non-sequential column addresses.

9. The method of claim 1, wherein coupling comprises coupling a first digit line with a first sense component, the method further comprising:
receiving, consecutively after a first activate address for the first digit line, a second activate address for a second digit line of the row;
coupling the second digit line with a second sense component based on the second activate address; and
communicating, over a data bus, a first logic value associated with the first digit line and a second logic value associated with the second digit line.

10. The method of claim 9, further comprising:
receiving, consecutively after a first read command for the first digit line, a second read command for the second digit line, wherein the first logic value and the second logic value are communicated based on receiving the first read command and the second read command.

11. The method of claim 9, wherein the control signals comprise a first control signal for a first multiplexer that is based on the first activate address, the method further comprising:
communicating a second control signal to a second multiplexer based on the second activate address, wherein the second digit line is coupled with the second sense component based on the second control signal.

12. A memory device, comprising:
a memory array comprising a row of memory cells coupled with respective digit lines;
a controller coupled with the memory array and configured to concurrently communicate each respective control signal of a set of respective control signals to each respective multiplexer via a single selection line associated with the respective multiplexer of a set of multiplexers coupled with the digit lines, wherein each respective control signal is received at the respective multiplexer via the respective single selection line and comprises a numerical bit sequence indicating a single digit line of a subset of the digit lines coupled with the respective multiplexer based on each digit line of the subset of the digit lines being associated with a respective numerical bit sequence;
a first multiplexer of the set of multiplexers, that is coupled with the controller and a first subset of the digit lines, the first multiplexer configured to couple a first digit line of the first subset of the digit lines with a first sense component based on the numerical bit sequence of a first control signal of the set of respective control signals, wherein the first multiplexer couples the first digit line concurrently with a second multiplexer of the set of multiplexers; and
the second multiplexer of the set of multiplexers, coupled with the controller and a second subset of the digit lines, the second multiplexer configured to couple a second digit line of the second subset of the digit lines with a second sense component based on the numerical bit sequence of a second control signal of the set of respective control signals, wherein the second multiplexer couples the second digit line concurrently with the first multiplexer.

13. The memory device of claim 12, wherein the first sense component is configured to sense a first logic state associated with the first digit line and the second sense component is configured to sense a second logic state associated with the second digit line.

14. The memory device of claim 12, wherein the first control signal has a first value and the second control signal has a second value different than the first value.

15. The memory device of claim 12, wherein the controller is configured to communicate the first control signal and the second control signal concurrently.

16. The memory device of claim 12, further comprising:
a third multiplexer coupled with a third subset of the digit lines, the third multiplexer configured to couple a third digit line of the third subset with a third sense component based on a third control signal of the set of respective control signals.

17. A memory device, comprising:
a memory array comprising a row of memory cells coupled with a set of multiplexers; and
one or more controllers coupled with the memory array and the set of multiplexers, the one or more controllers operable to cause the memory device to:
transfer voltages from memory cells of a row in the memory array to respective digit lines for the memory cells, the voltages indicative of logic values stored at the memory cells;
communicate respective control signals concurrently to each respective multiplexer via a single selection line associated with the respective multiplexer of the set of multiplexers, wherein each multiplexer is coupled with a respective subset of the digit lines and wherein each respective control signal is received at the respective multiplexer via the respective single selection line and comprises a numerical bit sequence indicating a single digit line of the respective subset of the digit lines based on each digit line of the respective subset of the digit lines being associated with a respective numerical bit sequence; and
couple, concurrently by each multiplexer and based on the numerical bit sequence of the control signal for that multiplexer, a digit line of the respective subset of digit lines with a sense component for that multiplexer.

18. The memory device of claim 17, further comprising:
a set of sense components comprising a sense component for each multiplexer, the set of sense components configured to sense logic values associated with the digit lines.

19. The memory device of claim 17, wherein the respective control signals comprise a first control signal communicated to a first multiplexer of the set of multiplexers and a second control signal communicated to a second multiplexer of the set of multiplexers.

20. The memory device of claim 19, wherein the first control signal has a first value and the second control signal has a second value different than the first value.

21. The memory device of claim 19, wherein the one or more controllers are configured to communicate the respective control signals concurrently.

22. The memory device of claim 19, wherein the respective control signals comprise a third control signal communicated to a third multiplexer of the set of multiplexers and a fourth control signal communicated to a fourth multiplexer of the set of multiplexers.

23. The memory device of claim 17, wherein the one or more controllers are configured to cause the memory device to couple a first digit line with a first sense component, and wherein the one or more controllers are further configured to cause the memory device to:
receive, consecutively after a first activate address for the first digit line, a second activate address for a second digit line of the row;
couple the second digit line with a second sense component based on the second activate address; and
communicate over a data bus a first logic value associated with the first digit line and a second logic value associated with the second digit line.

24. The memory device of claim 23, wherein the one or more controllers are configured to cause the memory device to:
receive, consecutively after a first read command for the first digit line, a second read command for the second digit line, wherein the first logic value and the second logic value are communicated based on receiving the first and second read commands.

* * * * *